United States Patent [19]
Yalamanchili

[11] Patent Number: 5,929,514
[45] Date of Patent: Jul. 27, 1999

[54] THERMALLY ENHANCED LEAD-UNDER-PADDLE I.C. LEADFRAME

[75] Inventor: Prasad V. V. Yalamanchili, Santa Clara, Calif.

[73] Assignee: Analog Devices, Inc., Norwood, Mass.

[21] Appl. No.: 09/084,671

[22] Filed: May 26, 1998

[51] Int. Cl.⁶ ............... H01L 23/495; H01L 23/48; H01L 23/52
[52] U.S. Cl. ............... 257/676; 257/666; 257/675; 257/692; 257/693; 257/696
[58] Field of Search .................. 257/675, 666, 257/676, 692, 693, 696

[56] References Cited

U.S. PATENT DOCUMENTS

| 5,334,872 | 8/1994 | Ueda et al. | 257/676 |
|---|---|---|---|
| 5,386,141 | 1/1995 | Liang et al. | 257/676 |
| 5,436,500 | 7/1995 | Park et al. | 257/696 |
| 5,459,641 | 10/1995 | Kuriyama | 257/696 |
| 5,650,918 | 7/1997 | Suzuki | 361/760 |
| 5,703,398 | 12/1997 | Sono et al. | 257/706 |
| 5,708,567 | 1/1998 | Shim et al. | 361/723 |
| 5,783,860 | 7/1998 | Jeng et al. | 257/675 |
| 5,796,159 | 8/1998 | Kierse | 257/668 |
| 5,861,668 | 1/1999 | Cha | 257/692 |

*Primary Examiner*—Carl Whitehead, Jr.
*Assistant Examiner*—Jesse A. Fenty
*Attorney, Agent, or Firm*—Koppel & Jacobs

[57] ABSTRACT

A "lead-under-paddle" (LUP) leadframe employs a thermally conductive paddle/heat sink, the top side of which is adhered to an I.C. die with a thermally conductive adhesive. The inner portions of an I.C. package's leads extend along and are attached to the bottom side of the paddle with a thermally conductive and electrically isolating adhesive. Heat generated by the die is conducted to the leads and out of the package via the paddle/heat sink. The leads are in close contact with the paddle and die, reducing the leadframe's thermal resistance, increasing the amount of power that can be consumed by the die, and enabling a standard I.C. package to accommodate a paddle and die having larger respective surface areas.

32 Claims, 9 Drawing Sheets

| | 16-Lead TSSOP LEADFRAME | | | | |
|---|---|---|---|---|---|
| | Thermal Resistance | Thermal Resistance Improvement | Maximum Paddle Size | Maximum Die Size | Die Size Increase |
| Standard TSSOP Leadframe (FIG.1) | 151 °C/W | | 118x118 mil$^2$ | 103x103 mil$^2$ | |
| LUP TSSOP Leadframe (FIG.6) | 98 °C/W | 35% | 123x186 mil$^2$ | 108x171 mil$^2$ | 74% |

THERMALLY ENHANCED LEAD-UNDER-PADDLE I.C. LEADFRAME

BACKGROUND OF THE INVENTION

1. Field of the Invention

This invention relates to the field of integrated circuit (I.C.) leadframes, and particularly to leadframes designed to provide improved heat dissipation.

2. Description of the Related Art

A I.C. package's "leadframe" typically includes the leads that extend from the package, the structure that supports the I.C. die, and any structures employed to hold these elements together. Many types of leadframes have been developed and are in use, including "lead-on-chip" (LOC) and "chip-on-lead" (COL) leadframes, for example.

Figure 1A:
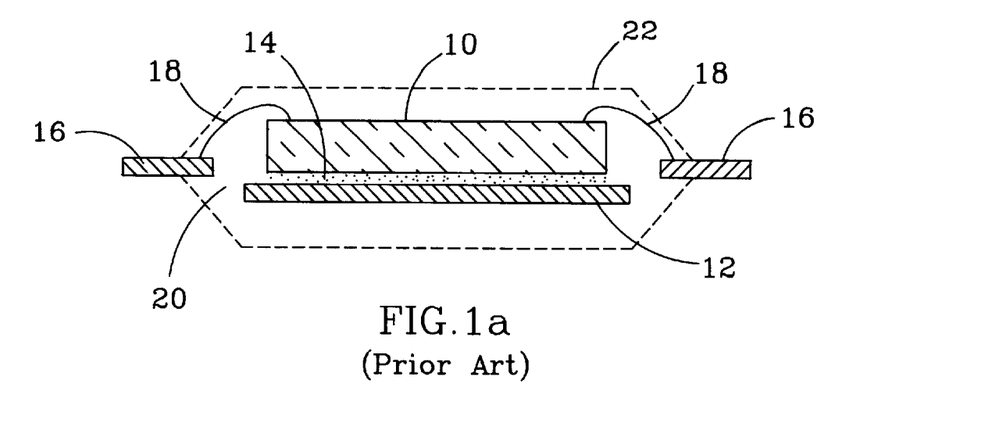
FIGS. 1a and 1b are cross-sectional (cut along section line 1a—1a) and plan views, respectively, of a prior art 16-lead TSSOP package leadframe.
Figure 1B:
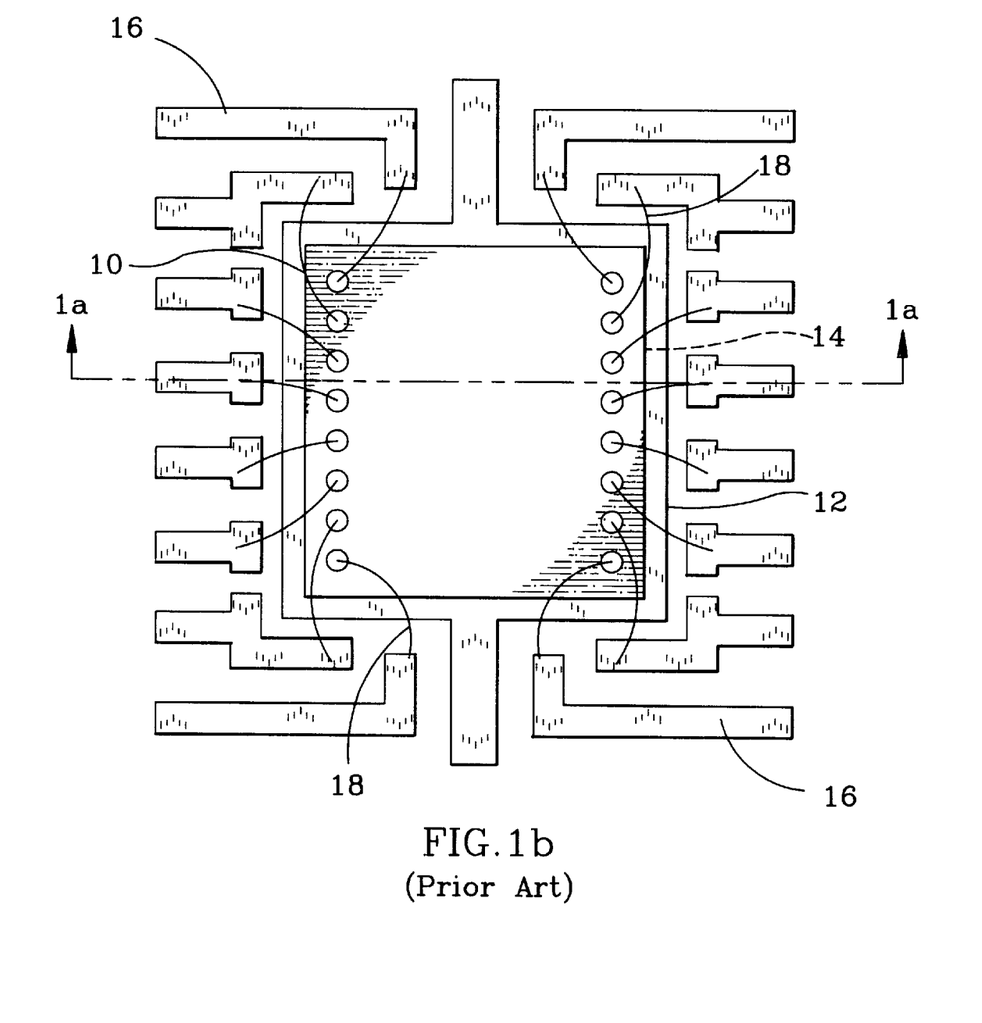

A standard 16-lead "thin shrink small outline package" (TSSOP) leadframe is shown in FIG. 1. An I.C. die 10 is on a "paddle" 12, and is secured to the paddle with some type of adhesive 14. The ends of the package's leads 16 which are to be connected to the die are placed near, but physically separate from the die, and the interconnections between the die and the leads are provided by wire bonds 18. The ends of the leads nearest the die are referred to herein as the "inner" portions of the leads, with the opposite ends referred to as the "outer" portions.

When operating, an I.C. die generates heat, and many leadframes include features to aid in dissipating the heat produced by the die. For example, in the leadframe of FIG. 1, the paddle 12 is often made of metal, and the adhesive 14 is thermally conductive, so that some of the heat generated by the die is conducted to the paddle. The physically separated paddle 12 and leads 16 are held in a desired proximity to each other with a mold compound 20, which forms the exterior of the I.C. package 22 (not shown in FIG. 1b for clarity). When heat is generated by I.C. die 10, it is conducted to the paddle as noted above, and then to the leads 16 through the mold compound 20. Unfortunately, however, molding compounds in common use have a very low thermal conductivity. This increases the thermal resistance between the die and the leads, and limits the amount of heat that can be dissipated by the die. The limited heat dissipation capabilities of such a package in turn limit the power that can be consumed by the I.C. die, as well as the uses to which the die can be put. Poor heat dissipation can also accelerate the failure rate of the die's circuitry. Furthermore, the spacing between the paddle and the leads necessarily limits the size of the die that can be accommodated in a standard package size.

SUMMARY OF THE INVENTION

A new leadframe is presented that greatly reduces the adverse impact of the problems noted above. The leadframe provides much improved heat dissipation, while allowing a larger die size to be accommodated within a standard I.C. package.

The novel "lead-under-paddle" (LUP) leadframe configuration described herein attaches an I.C. die to one side of a thermally conductive paddle/heat sink with a thermally conductive adhesive. The inner portions of the I.C. package's leads are made to extend below the paddle, and are attached to the paddle with an thermally conductive and electrically isolating adhesive. Heat generated by the die is conducted to the paddle/heat sink via the thermally conductive adhesive, and then out through the package's leads via the thermally conductive and electrically isolating adhesive.

Because the leads are in close contact with the paddle and die, the thermal resistance of the leadframe is greatly reduced, which increases the amount of power that can be consumed by the die. Also, because the physical spacing between the paddle and leads is eliminated, a standard I.C. package can accommodate a paddle and a die having greater respective surface areas than was possible with a standard leadframe.

The LUP leadframe can be used with packages having leads on two sides, such as TSSOP, "small outline integrated circuit" (SOIC), "mini small outline package" (MSOP), "plastic dual in-line package" (PDIP) and "shrink small outline package" (SSOP) packages, as well as with quad-sided packages such as the "plastic leaded chip carrier" (PLCC) and "quad flat package" (QFP) packages, and can be employed to provide either downset and flat leadframes as needed. Assembly of the LUP leadframe is very similar to the assembly of a standard leadframe, with no additional processing steps or assembly equipment required.

Further features and advantages of the invention will be apparent to those skilled in the art from the following detailed description, taken together with the accompanying drawings.

DETAILED DESCRIPTION OF THE INVENTION

Figure 2A:
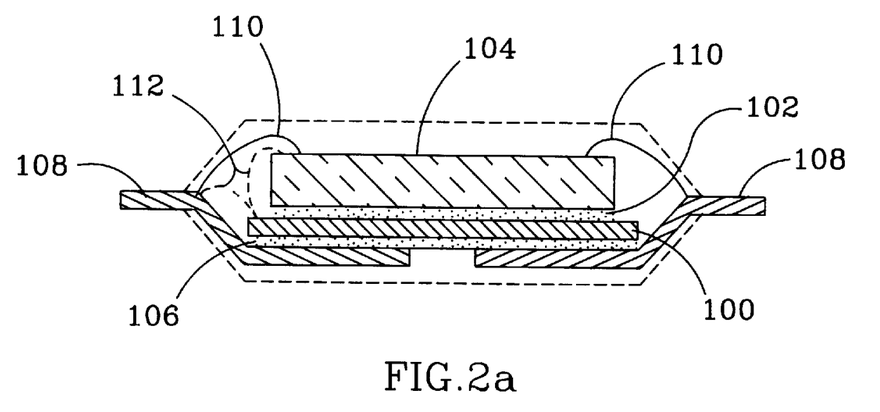
FIGS. 2a and 2b are cross-sectional (cut along section line 2a—2a) and plan views, respectively, of an LUP leadframe per the present invention.
Figure 2B:
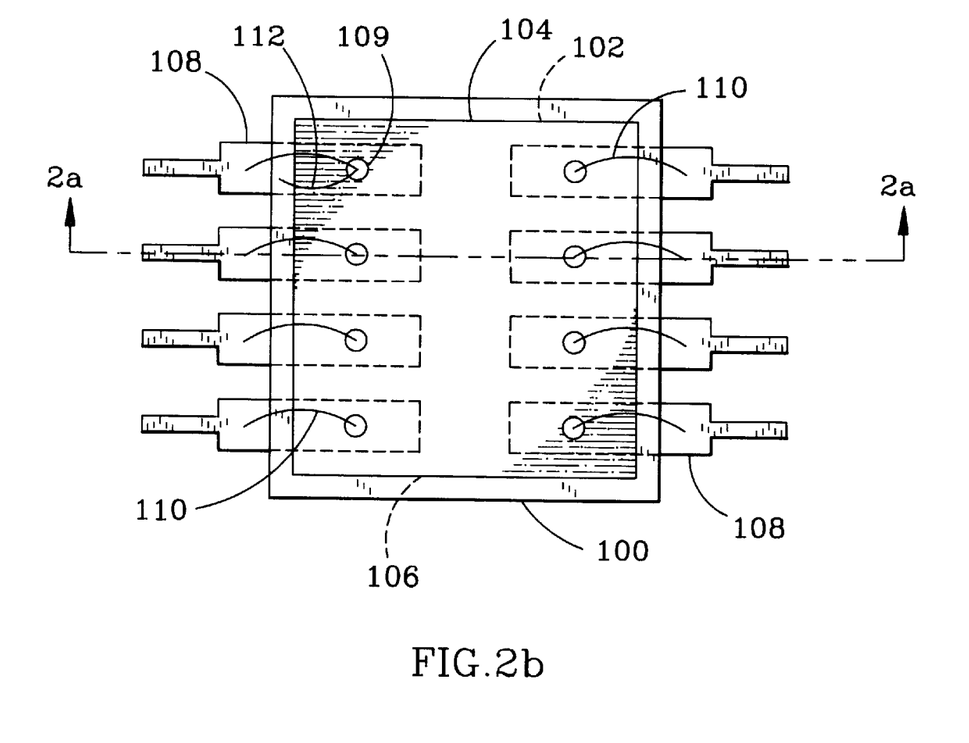

Cross-sectional and plan views of an LUP leadframe per the present invention are shown in FIGS. 2a and 2b, respectively. The LUP leadframe includes a thermally conductive paddle/heat sink 100 which has a top side and a bottom side. A thermally conductive adhesive 102 is applied to the top side, suitable for affixing an I.C. die 104 to the paddle. An electrically isolating and thermally conductive adhesive 106 is applied to the bottom of the paddle 100. The inner portions of the I.C. package's leads 108 extend along the bottom side of paddle 100, and are attached to the paddle with adhesive 106. Wire bonds 110 connect the die to the leads. Because the inner portions of the package's leads extend along and are affixed to the bottom side of the paddle, the leadframe's construction is referred to as "lead-under-paddle" (LUP).

Heat generated by I.C. die 104 is conducted via thermally conductive adhesive 102 to the paddle/heat sink 100, and then to the leads 108 via electrically isolating and thermally conductive adhesive 106. The heat is then dissipated into the ambient air and the printed circuit board (PCB) to which the leads are connected as it travels to the outer portions of the leads. With paddle/heat sink 100 serving as the interface between the die and the leads, rather than the mold compound of the prior art, the thermal resistance of the leadframe is significantly reduced.

Because the physical spacing between the leads and paddle found in the prior art is eliminated, the area of both the paddle and the die that can be accommodated within a given package size is increased. This advantage can be fully realized because of the leadframe's improved ability to dissipate the heat that might be produced by a larger die.

The thermally conductive adhesive 102 is also preferably electrically conductive, which, in conjunction with a conductive paddle 100 as described below, provides a means of applying a desired voltage potential to die 104. Many acceptable electrically and thermally conductive adhesives are available, such as "ABLEBOND" 84-1LMISR4 from ABLESTICK Laboratories in Rancho Dominguez, Calif.

The adhesive 106 used to attach paddle 100 to the leads 108 must be both electrically isolating and thermally conductive. An electrically isolating characteristic is needed to prevent the paddle 100 from shorting the leads 108 together, and a thermally conductive characteristic is needed so that heat conducted from the die is efficiently transferred to the leads. A number of adhesives with these characteristics are available; for example, a polyimide adhesive such as "ABLELOC" 5500 from ABLESTICK Laboratories in Rancho Dominguez, Calif.

To achieve the invention's improved thermal performance, the paddle 100 must be thermally conductive. Paddle 100 is also preferably electrically conductive; a paddle made from copper is preferred. When paddle 100 and adhesive 102 are electrically conductive, a potential can be conveniently applied to die 104. This is accomplished by providing a conductive path 112, preferably using a wire bond, between the paddle 100 and one of the package's leads. The wire bond can connect to either the inner portion of a lead 108, or to a contact area 109 on the top of die 104. In this way, a voltage potential such as ground or a positive or negative supply voltage, can be applied to both the paddle 100 and the die 104.

The package leads are also preferably copper, because of copper's good electrical and thermal conductivity. Preferably, the inner portions of each of an I.C. package's leads extend under and are attached to the paddle; having each lead in close contact with the paddle provides the greatest number of thermal dissipation paths and a substantially improved thermal resistance. However, it is not essential that every lead be attached to the paddle in this fashion. If at least one lead is affixed to the bottom of the paddle, some of the thermal benefits of the LUP leadframe construction will be realized; however, affixing at least a majority of the leads to the paddle is recommended to obtain a substantial improvement in thermal resistance. Note that leads which are physically separated from the paddle are likely to reduce the maximum area available for the paddle and die, as in the prior art.

The present LUP is adaptable to I.C. packages having leads extending from two sides, such as SOIC, TSSOP, MSOP, PDIP and SSOP packages, as well as to quad-sided packages, such as the PLCC and OFP types. An exemplary quad-sided LUP leadframe per the present invention is shown in the cross-sectional and plan views of FIGS. 3a and 3b, respectively. The basic construction is the same as for the LUP leadframe in FIGS. 2a and 2b: a die 120 (not shown in FIG. 3b for clarity) is attached to a thermally conductive paddle 122 with a thermally conductive die attached adhesive 124, and the paddle is attached to the package's leads 126 with an electrically isolating and thermally conductive adhesive 128. As can be seen in FIG. 3b, the leads can implemented in various lengths to cover more paddle surface area, thereby lowering thermal resistance. The leads could also be implemented in equal lengths, but to insure that the leads nearest the sides of the quad-sided package do not contact each other, the distance which the leads can extend along the paddle surface is necessarily limited.

Figure 4A:
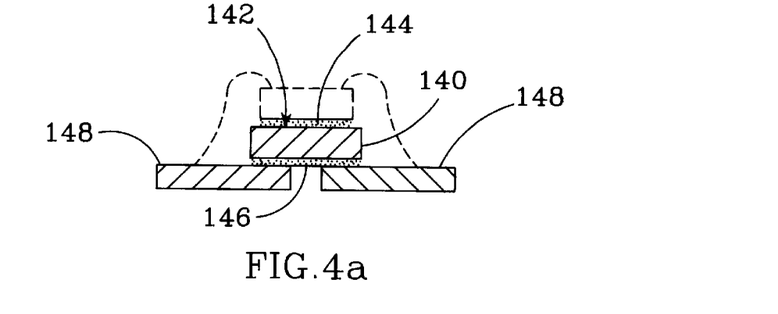
FIGS. 4a and 4b are cross-sectional (cut along section line 4a—4a) and plan views, respectively, of an LUP leadframe per the present invention, showing the lead-holding rails employed during leadframe assembly.
Figure 4B:
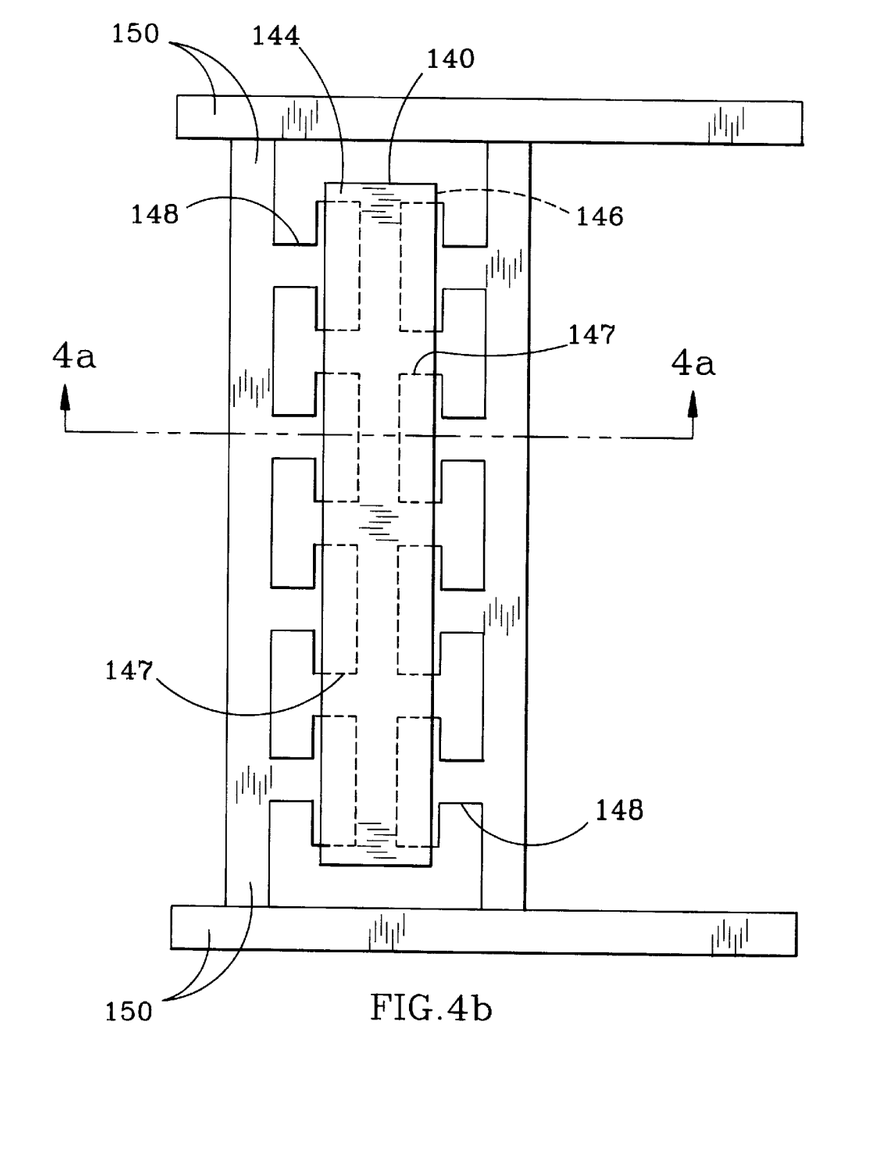

Another embodiment of an LUP leadframe for an I.C. package is shown in the cross-sectional and plan views of FIGS. 4a and 4b, respectively. A thermally conductive paddle/heat sink 140, preferably copper, has an electrically and thermally conductive adhesive applied to its top side 142, for securing an I.C. die 144 to the paddle, and a electrically isolating and thermally conductive adhesive 146 to its bottom side. The inner portions 147 of each of the package's leads 148 extend under the paddle 140, and are secured to the paddle with adhesive 146.

As can be seen in FIG. 4b's plan view, the package's leads are shown still attached to rails 150, as they would be prior to the singulation step in a typical leadframe assembly process, in which the leads are cut from the rails. The dimensions of the leads increase as they pass under the paddle 140, so that as much paddle area as practically possible is in close contact with the leads; the package's thermal efficiency increases with the amount of paddle area in contact with leads. When an LUP leadframe of this type is used within an I.C. package having leads extending from two opposing sides, the leads preferably extend nearly halfway across the surface area of the paddle between the two opposing sides—to cover as much surface area as possible without shorting opposing leads together.

Figure 3A:
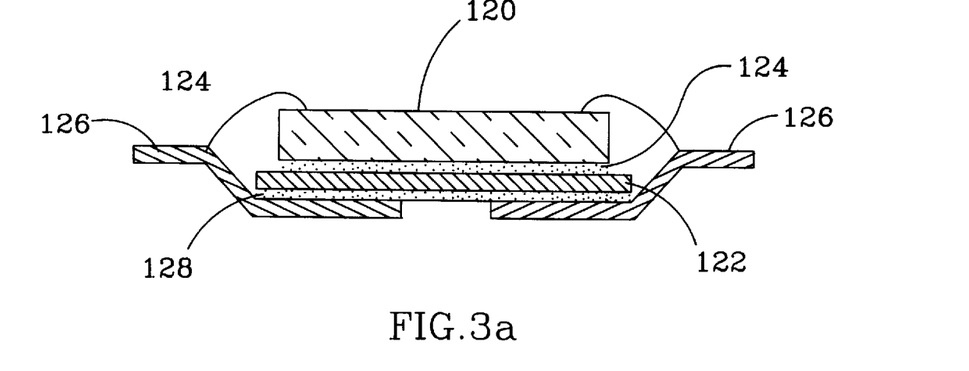
FIGS. 3a and 3b are cross-sectional (cut along section line 3a—3a) and plan views, respectively, of a quad-sided LUP leadframe per the present invention.
Figure 3B:
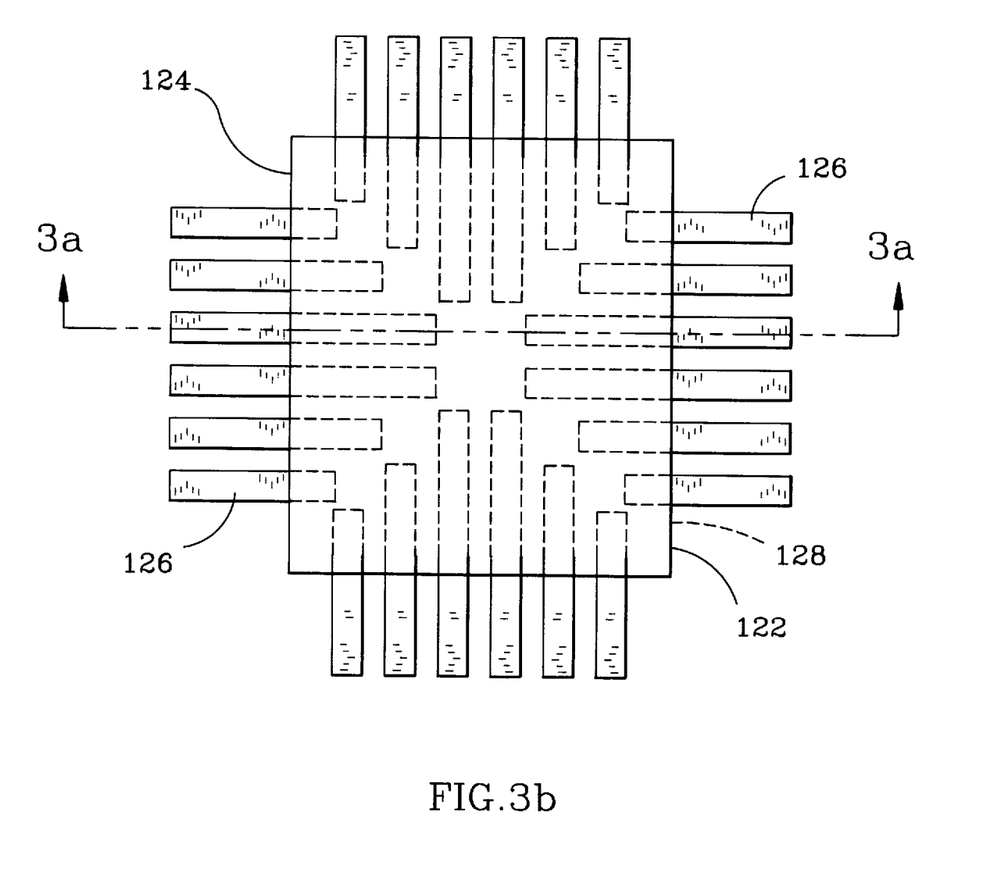

The leadframe of FIGS. 4a and 4b is a flat leadframe, as opposed to the downset leadframes seen in FIGS. 2 and 3. The LUP leadframe construction described herein is equally adaptable to both flat and downset leadframes.

Figure 5:
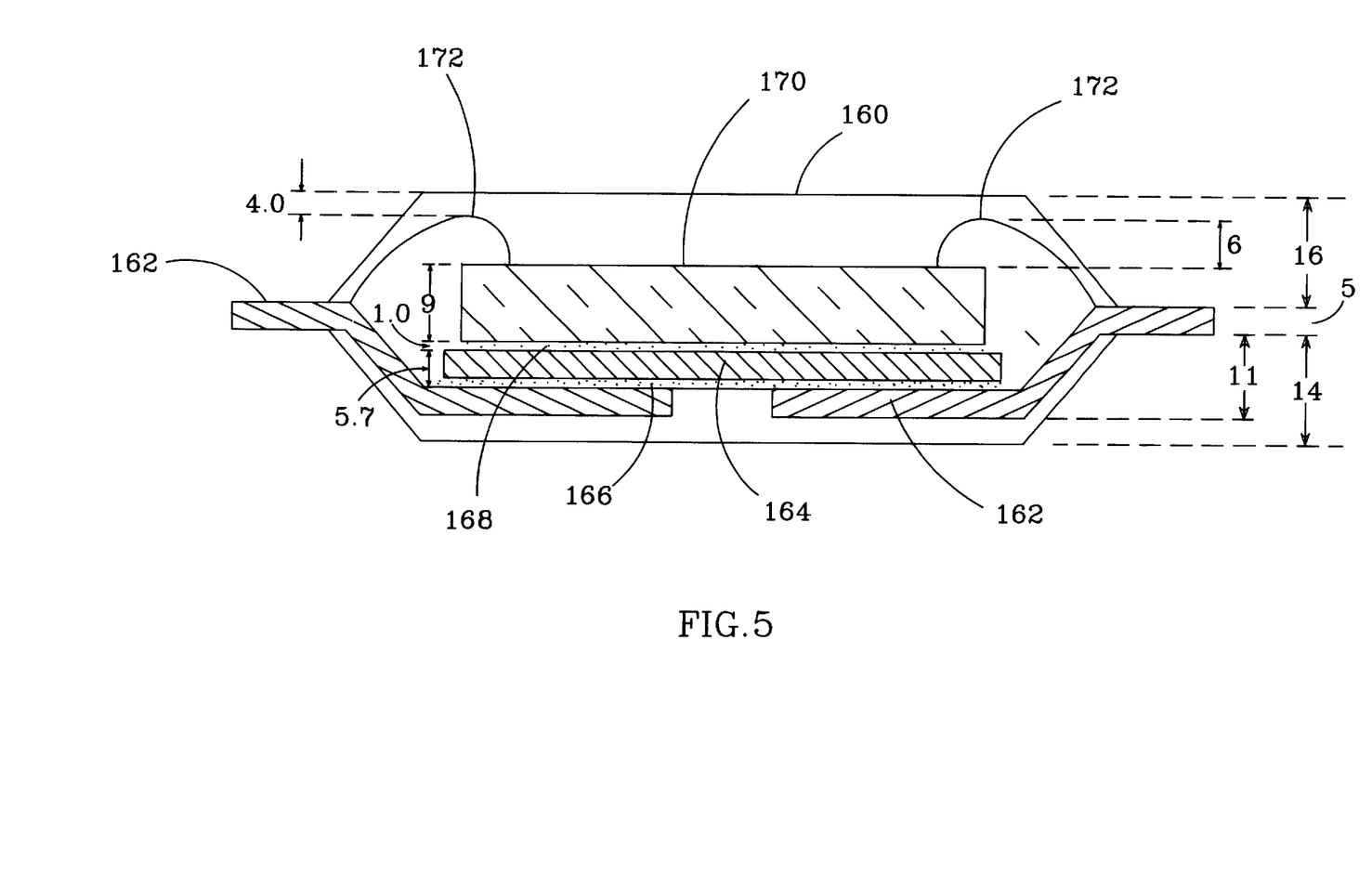
FIG. 5 is a sectional view of a TSSOP I.C. package incorporating an LUP leadframe with downset leads per the present invention.

FIG. 5 is a sectional view of a TSSOP incorporating an LUP leadframe. Some of the leadframe's vertical dimensions are shown to demonstrate how the leadframe's novel construction is accommodated within a standard thin package outline. The TSSOP package 160 is about 35 mils in height, which includes a lead thickness of about 5 mils, 16 mils above the leads, and 14 mils below the leads. In this exemplary configuration, the leads 162 are downset by about 11 mils; the LUP leadframe structure places no limitations on the amount of downset allowed, through a downset of between 6 and 12 mils is preferred in a TSSOP package so that all of the package's components may be accommodated. The paddle/heat sink 164 is attached to the leads 162 with an electrically isolating and thermally conductive adhesive 166. Adhesive 166 in combination with paddle 164 are about 5.7 mils thick; paddle 164 is preferably about 4–6 mils thick, and adhesive layer 166 is preferably less than 1 mil thick.

The electrically and thermally conductive layer 168 on top of paddle 164 is preferably about 1 mil thick, and the die 170 is preferably about 9 mils thick. This leaves approximately 10 mils between the top of the die 170 and the top of the package 160. About 6 mils is allowed to accommodate the wire bonds 172, with about 4 mils of clearance remaining.

Providing a thermally-enhanced leadframe as described herein into a thin package such as a TSSOP required considerable effort. A TSSOP is only about 35 mils thick. For a typical die 170 to fit within the package with leads 162, adhesive 166, paddle 164 and adhesive 168 below it, it was desirable that electrically isolating and thermally conductive adhesive 166 be less than 1 mil thick. However, most such adhesives are either about 3–6 mils thick, or prohibitively expensive. This problem was resolved by using a product from Mitsui-High Tech in Japan to provide both the paddle 164 and the adhesive 166. Mitsui-High Tech screen prints an adhesive layer that is about 0.7 mils onto a copper foil that is about 5 mils thick. The copper foil is innovatively employed as paddle 164, and the screen printed adhesive serves as adhesive 166.

As previously noted, the LUP leadframe provides an increase in maximum paddle and die size for a given I.C. package type. Getting the greatest possible improvement requires the capability of precisely positioning the paddle on the leads. Mitsui-High Tech in Japan is one vendor capable of providing the precise positioning necessary to achieve the improvements in die size claimed herein.

Figure 6A:
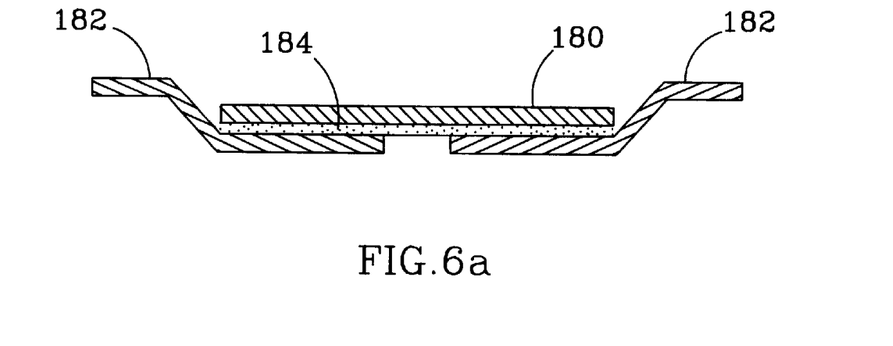
FIGS. 6a and 6b are cross-sectional (cut along section line 6a—6a) and plan views, respectively, of a 16-lead TSSOP package leadframe per the present invention.
Figure 6B:
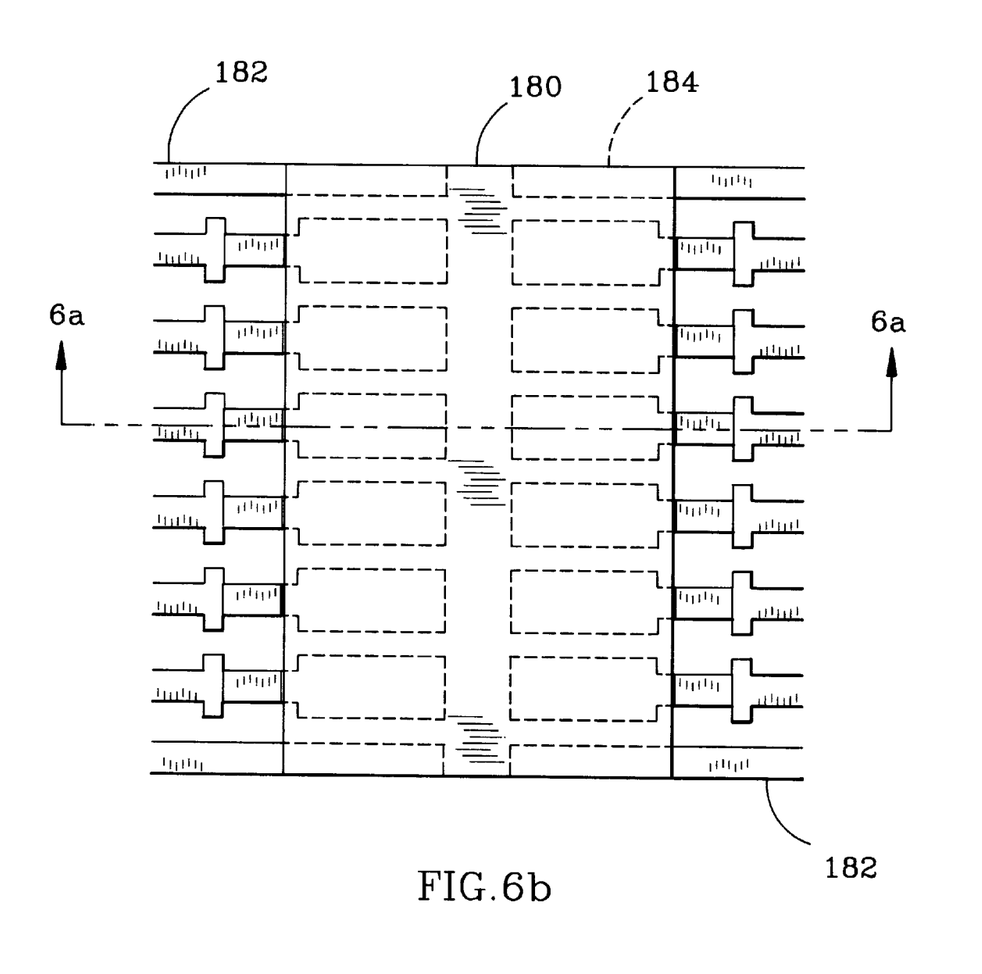
Figure 7:
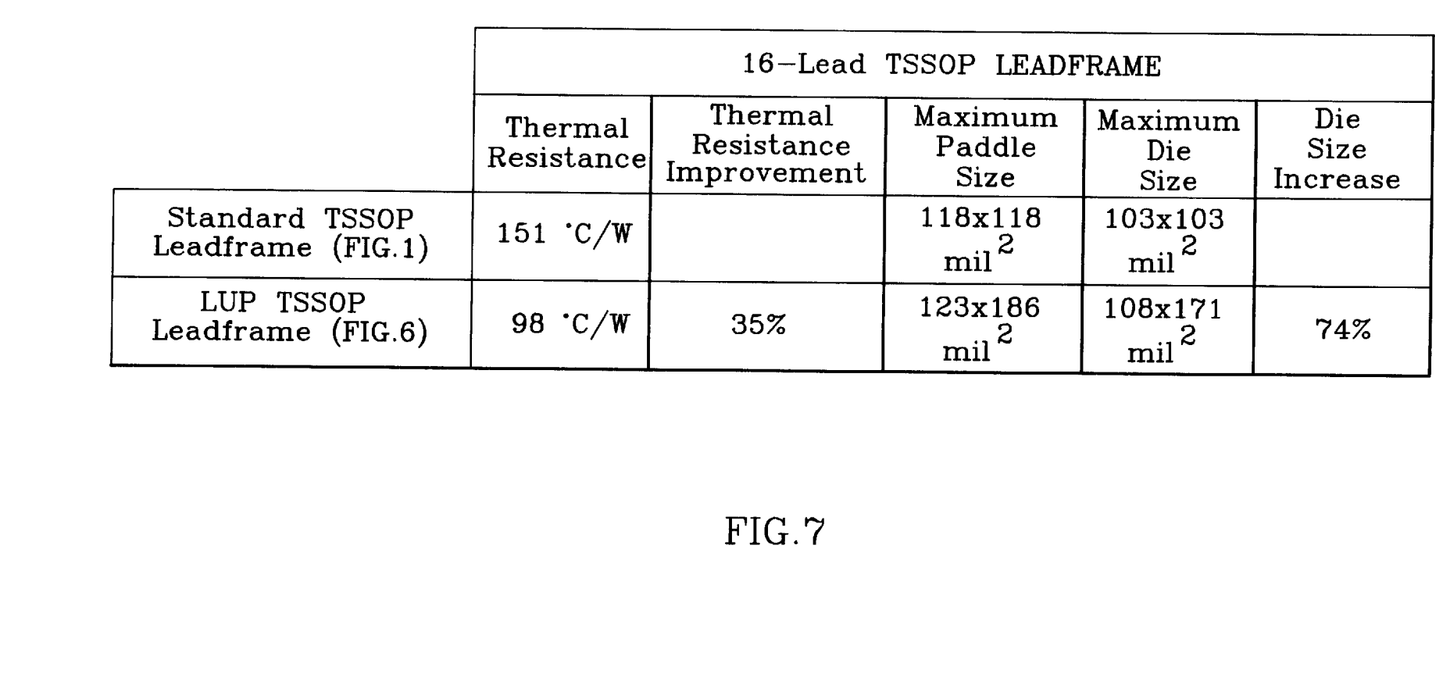
FIG. 7 is a table comparing thermal resistance and maximum die and paddle sizes between a standard 16-lead TSSOP leadframe and a 16-lead TSSOP leadframe per the present invention.

To demonstrate the improvement in thermal resistance and the increase in paddle and die size achievable with the invention, an LUP leadframe for use in a 16-lead TSSOP package is shown in the cross-sectional and plan views of FIGS. 6a and 6b, respectively, and a table is then presented in FIG. 7 that compares the 16lead LUP leadframe of FIG. 6 with the standard 16-lead TSSOP package leadframe of FIG. 1. Shown are a paddle 180, leads 182 and an adhesive layer 184 that holds the leads to the paddle. As can be seen from the table, the new leadframe reduces thermal resistance by about 53° C./watt (35%), increases the maximum paddle size (by about 64%), and increases the maximum die size by about 74%.

The 16-lead TSSOP LUP leadframe shown and described in FIGS. 6 and 7 is intended as only an example of the improvements in thermal resistance and paddle and die size that are achieved with the LUP leadframe. Similar improvements are achieved for other packages that incorporate the LUP leadframe concept described herein, including TSSOP packages having lead counts other than 16, as well as all the dual and quad-sided packages previously listed.

A problem frequently encountered in the field of leadframe design is that of the coplanarity of the package's leads; i.e., the inner portions of an I.C. package's leads should all lie in the same plane. If coplanarity cannot be maintained, the leadframe could electrically short the die. With a chip-on-lead leadframe, for example, it is difficult to downset the leads, due to the difficulty of maintaining coplanarity when the die is attached to the leads. The LUP leadframe avoids the coplanarity problem by having the paddle mounted to the leads by the leadframe vendor.

Figure 8A:
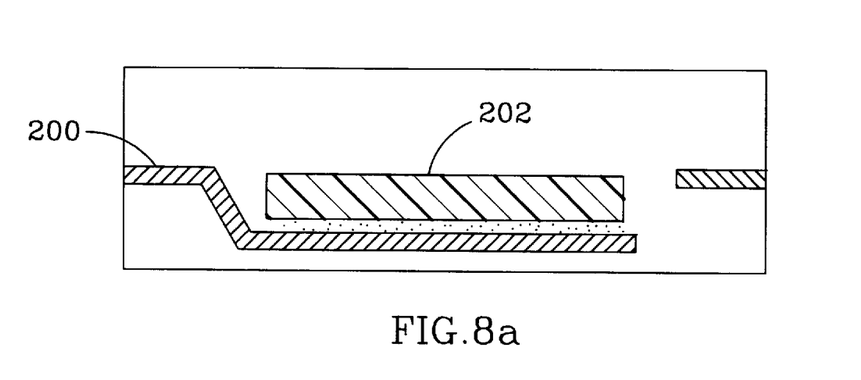
FIGS. 8a and 8b are cross-sectional (cut along section line 8a—8a) and plan views, respectively, of an alternate embodiment of a leadframe per the present invention.
Figure 8B:
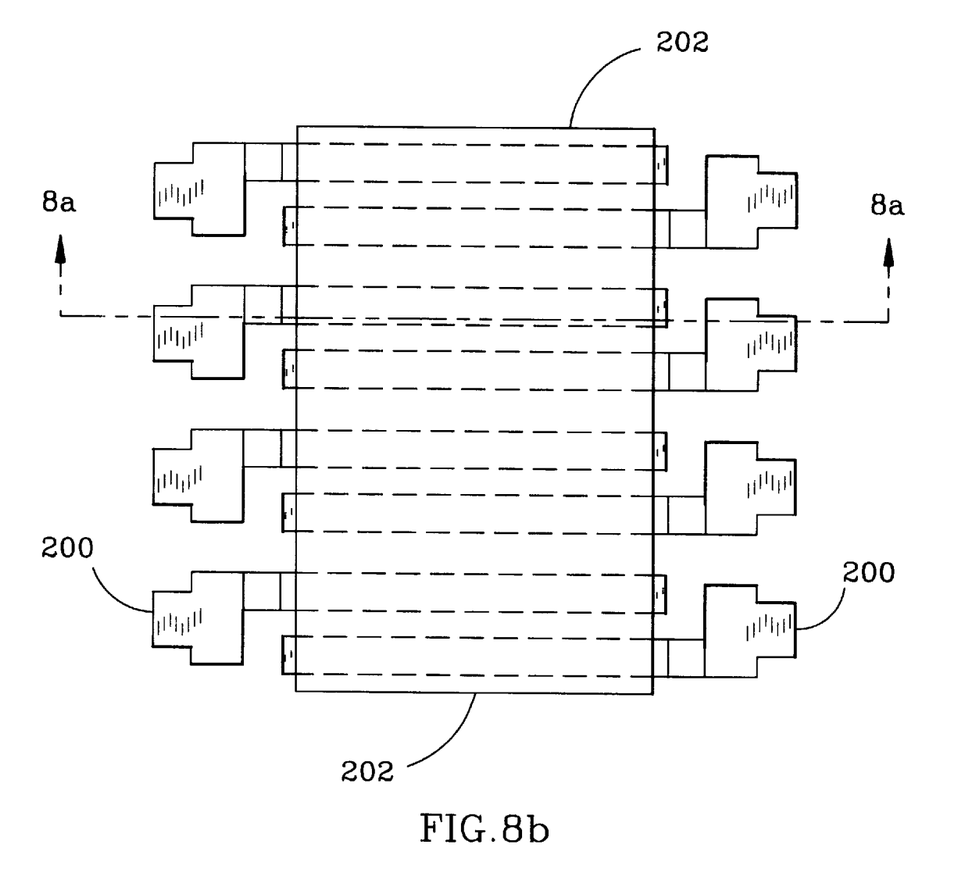

An alternative embodiment of an LUP leadframe per the present invention is shown in the cross-sectional and plan views of FIGS. 8a and 8b, respectively. Here, rather than having the package's leads extend nearly halfway across the paddle, as in the leadframes of FIGS. 2, 4, 5 and 6, the downset leads 200 are made to extend nearly all the way across the bottom side of the paddle 202. This configuration virtually eliminates the coplanarity issue from consideration.

Other leadframes that purport to offer improved thermal performance typically involve the attachment of a heat sink that requires additional, expensive assembly process steps. The present LUP leadframe does not require any additional processing steps or special assembly equipment. Rather, the LUP leadframe undergoes the same assembly process steps as a standard leadframe, while offering the benefits of lower thermal resistance and larger die size.

Figure 9:
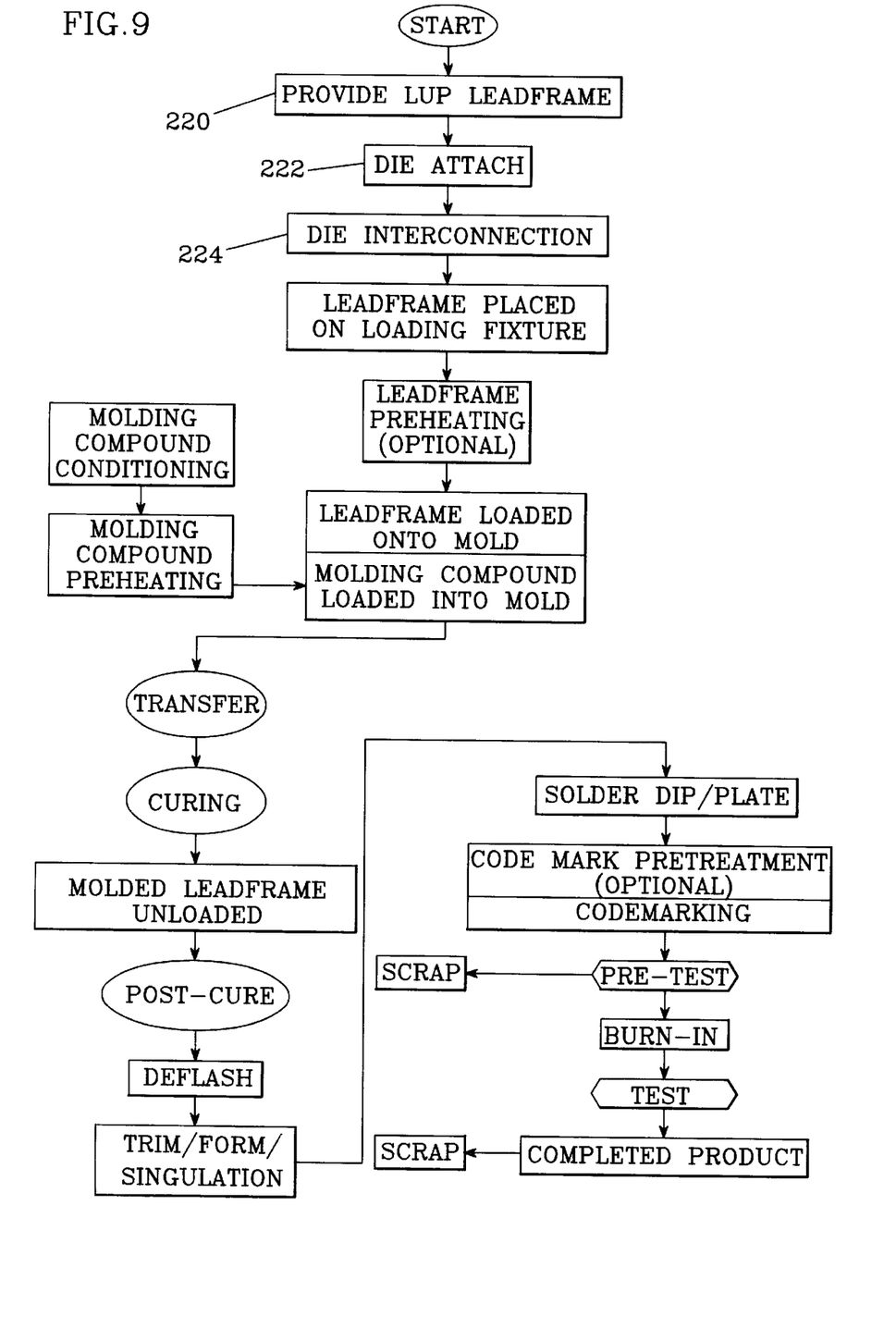
FIG. 9 is a flow chart showing a typical assembly process sequence for an I.C. package that includes a leadframe per the present invention.

A process sequence for assembling an I.C. package which includes an LUP leadframe is shown in FIG. 9. As a first step (220), an LUP leadframe such as that shown in FIG. 4, with rails, leads and paddle assembled into a complete unit, is provided by a leadframe vendor such as Mitusi-High Tech in Japan. In step 222, the I.C. die is attached to the leadframe's paddle, and wire bonds are connected between the die and the leads in step 224. The remaining steps of the assembly process are performed as shown in FIG. 9, resulting in a packaged I.C. that, when compared with an I.C. using a standard leadframe, features improved thermal efficiency while accommodating a larger surface area die.

The LUP leadframe described herein is applicable to I.C. packages in which the active surface of the I.C. die is facing away from the PCB to which the package is attached. It is equally applicable, however, to "inverted" I.C. packages, the leads of which are formed such that when the package is mounted to the PCB, the die's active surface is facing towards the board. The package's internal lead/adhesive/paddle/adhesive/die sandwich structure is the same for either type of package.

While particular embodiments of the invention have been shown and described, numerous variations and alternate embodiments will occur to those skilled in the art. Accordingly, it is intended that the invention be limited only in terms of the appended claims.

I claim:

1. A thermally enhanced lead-under-paddle (LUP) integrated circuit (I.C.) leadframe, comprising:

a thermally conductive die paddle for supporting an I.C. die, said paddle having top and bottom sides, a first thermally conductive adhesive on said top side of said paddle suitable for securing an I.C. die to said top side of paddle, a second thermally conductive and electrically isolating adhesive on said bottom side of said paddle for attaching said paddle to a plurality of I.C. package leads, and a plurality of I.C. package leads, each of said leads having inner and outer portions with respect to an I.C. package, the inner portions of a majority of said leads extending along said bottom side of said paddle and attached to said paddle with said second thermally conductive and electrically isolating adhesive, thereby forming an LUP leadframe, said LUP leadframe for use within an I.C. package of a given size, said LUP leadframe construction substantially lowering the thermal resistance between an I.C. die secured to said paddle and said plurality of leads and substantially increasing the respective maximum surface areas of a paddle and an I.C. die that can be accommodated in an I.C. package of said given size, when compared with leadframes for I.C. packages of said given size having no leads in close contact with said paddle.

2. The leadframe of claim 1, wherein said thermally conductive die paddle comprises an electrically conductive material.

3. The leadframe of claim 2, wherein said paddle is copper.

4. The leadframe of claim 2, wherein said first thermally conductive adhesive is electrically conductive so that an I.C. die mounted to said paddle is electrically connected to said paddle.

5. The leadframe of claim 4, further comprising a conductive path between said paddle and one of said leads for providing a desired voltage potential on said paddle and thereby to an I.C. die mounted to said paddle.

6. The leadframe of claim 5, wherein said conductive path is a wire bond.

7. The leadframe of claim 1, wherein said paddle has a thickness of about 4–6 mils.

8. The leadframe of claim 1, wherein said plurality of leads are flat and lie in the same plane such that said leadframe is a flat leadframe.

9. The leadframe of claim 1, wherein said plurality of leads lie in a first plane at outer portions, bend downward as they near said paddle, and lie in a second plane at their inner portions, such that said leadframe is a downset leadframe.

10. The leadframe of claim 9, wherein said leads are downset by 6–12 mils.

11. The leadframe of claim 1, wherein said second thermally conductive and electrically isolating adhesive is a polyimide adhesive.

12. The leadframe of claim 1, wherein said second thermally conductive and electrically isolating adhesive has a thickness of less than 1 mil.

13. The leadframe of claim 1, further comprising an I.C. die mounted to said paddle with said first thermally conductive adhesive.

14. The leadframe of claim 1, wherein said plurality of leads are copper.

15. The leadframe of claim 1, wherein said paddle and said second thermally conductive and electrically isolating adhesive comprise a sheet of copper having a layer of said second thermally conductive and electrically isolating adhesive screen printed on one side of said foil.

16. The leadframe of claim 15, wherein said copper sheet is about 5 mils thick and said second thermally conductive and electrically isolating adhesive layer is less than 1 mil thick.

17. The leadframe of claim 1, wherein the inner portions of each of said plurality of leads extends along said bottom side of said paddle and is attached to said paddle with said second thermally conductive and electrically isolating adhesive.

18. The leadframe of claim 17, wherein said paddle has leads extending from opposing first and second sides and the inner portions of each of said leads extends nearly half way across the surface area of said paddle between said first and second sides.

19. The leadframe of claim 18, wherein said leadframe is placed within a thin shrink small outline package (TSSOP).

20. The leadframe of claim 17, wherein said paddle has leads extending from opposing first and second sides and the inner portions of each of said leads extends nearly all the way across the surface area of said paddle between said first and second sides.

21. The leadframe of claim 17, wherein said paddle has leads extending from opposing first and second sides and from opposing third and fourth sides, the inner portions of each of said leads extending along the bottom side of said paddle.

22. A thermally enhanced lead-under-paddle (LUP) integrated circuit (I.C.) leadframe for a 16-lead thin shrink small outline package (TSSOP), comprising:

an electrically and thermally conductive paddle having top and bottom sides, each of said top and bottom sides having a surface area greater than 118×118 mil$^2$, an electrically and thermally conductive adhesive applied to said top side of said paddle for securing an I.C. die to said paddle, an electrically isolating and thermally conductive adhesive applied to the bottom side of said paddle for attaching said paddle to a plurality of I.C. package leads, and sixteen I.C. package leads, the inner portions of each of said leads extending along said bottom side of said paddle and attached to said paddle with said electrically isolating and thermally conductive adhesive, thereby forming an LUP leadframe, said LUP leadframe construction providing a thermal resistance between an I.C. die secured to said paddle and said plurality of leads of less than about 100° C./watt and accommodating an I.C. die having a surface area of greater than 103×103 mils$^2$.

23. The leadframe for a TSSOP of claim 22, wherein said paddle is copper.

24. The leadframe for a TSSOP of claim 22, wherein each of said sixteen leads are copper.

25. The leadframe for a TSSOP of claim 22, wherein said top and bottom sides of said paddle each have a surface area of about 123×186 mils$^2$.

26. The leadframe for a TSSOP of claim 22, wherein said paddle can accommodate an I.C. die having a surface area of about 108×171 mils$^2$.

27. The leadframe of claim 22, wherein eight of said sixteen leads extend from a first side of said paddle and the remaining eight leads extend from a second side of said paddle opposite said first side and the inner portions of each of said leads extends nearly half way across the surface area of the bottom of said paddle between said first and second sides.

28. The leadframe of claim 22, further comprising an I.C. die mounted to said paddle with said electrically and thermally conductive adhesive.

29. An thermally enhanced integrated circuit (I.C.) package having a lead-under-paddle (LUP) leadframe, comprising:

a thermally conductive die paddle for supporting an I.C. die, said paddle having top and bottom sides, a first thermally conductive adhesive on said top side of said paddle suitable for securing an I.C. die to said top side of paddle, a second thermally conductive and electrically isolating adhesive on said bottom side of said paddle for attaching said paddle to a plurality of I.C. package leads, a plurality of leads, each of said leads having inner and outer portions, the inner portions of a majority of said leads extending along said bottom side of said paddle and attached to said paddle with said second thermally conductive and electrically isolating adhesive, thereby forming an LUP leadframe, an I.C. die mounted to said paddle with said first thermally conductive adhesive, and an enclosure encapsulating said LUP leadframe except for the outer portions of said plurality of leads, said outer portions of said leads extending out from said enclosure, said LUP leadframe construction substantially lowering the thermal resistance between said I.C. die secured to said paddle and said plurality of leads and substantially increasing the respective maximum surface areas of said paddle and said I.C. die that can be accommodated in said I.C. package, when compared with leadframes for I.C. packages of the same size having no leads in close contact with said paddle.

30. The I.C. package of claim 29, wherein the inner portions of each of said plurality of leads extends along said bottom side of said paddle and is attached to said paddle with said second thermally conductive and electrically isolating adhesive.

31. The I.C. package of claim 29, wherein said outer portions of said leads are suitable for connection to a printed circuit board (PCB) and are configured such that, when connected to said PCB, the active surface of said I.C. die is facing away from said PCB.

32. The I.C. package of claim 29, wherein said outer portions of said leads are suitable for connection to a printed circuit board (PCB) and are configured such that, when connected to said PCB, the active surface of said I.C. die is facing towards said PCB.

* * * * *